United States Patent
Ku et al.

(10) Patent No.: US 7,521,927 B2
(45) Date of Patent: Apr. 21, 2009

(54) MAGNETIC INDUCTION SWITCHING CIRCUITS AND METHODS

(75) Inventors: Ming Hua Ku, Xinwu Shiang, Taoyuan County (TW); Ching Hsieng Lee, Hsinchu (TW)

(73) Assignee: Anachip Corporation (TW)

( * ) Notice: Subject to any disclaimer, the term of this patent is extended or adjusted under 35 U.S.C. 154(b) by 268 days.

(21) Appl. No.: 11/452,885

(22) Filed: Jun. 14, 2006

(65) Prior Publication Data

US 2007/0095137 A1    May 3, 2007

(30) Foreign Application Priority Data

Jun. 15, 2005    (TW) ............... 2005 2 0109781 U

(51) Int. Cl.
*G01R 33/02* (2006.01)
*G01R 33/06* (2006.01)
*H03K 3/45* (2006.01)
*H03K 17/80* (2006.01)

(52) U.S. Cl. .................. 324/244; 324/251; 327/510

(58) Field of Classification Search ............. 324/207.12, 324/207.2, 207.21, 207.26, 251, 252, 117 R, 324/117 H; 323/294, 368; 327/510, 511; 338/32 R, 32 H; 73/514.39

See application file for complete search history.

(56) References Cited

U.S. PATENT DOCUMENTS 6,727,684 B2 * 4/2004 Hatanaka ............... 324/117 H

OTHER PUBLICATIONS

Datasheet, AnaChip Low Power Hall Effect Switch, Rev. 1.3, Mar. 29, 2006.

* cited by examiner

*Primary Examiner*—Kenneth J Whittington
(74) *Attorney, Agent, or Firm*—Chad R. Walsh; Fountainhead Law Law Group P.C.

(57) ABSTRACT

A magnetic induction switching circuit comprising a magnetic induction device for sensing a magnetic field and generating signals corresponding to the polarity of the field. A detection control unit detects the signals generated in response to a magnetic field and configures a programmable switching unit so that the first signal generated in response to a detected magnetic field having a first polarity is coupled through the switching unit and subsequent signals generated in response to detecting different polarity magnetic fields are not coupled through the switching unit.

18 Claims, 6 Drawing Sheets

MAGNETIC INDUCTION SWITCHING CIRCUITS AND METHODS

CROSS REFERENCE TO RELATED APPLICATIONS

This application claims priority to Taiwanese Patent Application No. 200520109781.4 filed on Jun. 15, 2005.

BACKGROUND

The present invention relates to switching circuits, and in particular, to the use of magnetic induction in switching circuits to determine what type of magnetic field, namely in what polarity, will be the target for detection on the basis of environmental conditions.

In recent years, magnetic induction switching circuits using a magnetic inductor as the main body have been widely used in such fields as position sensing and rotation sensing. For instance, inside the upper or lower body of a cellular phone, the magnetic induction switching circuit is set up to detect the distance between the upper body and the lower body, and the sensed result is used as the basis for power control.

FIG. 1 is a magnetic induction switching circuit as used in the known technology. The magnetic induction switching circuit 10 may comprise a Hall Effect integrated circuit (Hall IC) 100, amplifier 110, Schmitt trigger circuit 120 and transistor 130. In the operation of the magnetic induction switching circuit 10, Hall IC 100 detects the presence of a magnetic field and generates a potential difference on the two terminals thereof on the basis of the magnetic flux. The electric potential difference as delivered on the two terminals of Hall IC 100, after being amplified through amplifier 110, will further be processed by Schmitt trigger circuit 120. If the amplified electric potential difference is larger than a default (e.g., a predetermined threshold) circuit 120 will generate an output to control the conduction of transistor 130.

However, this type of magnetic induction switching circuit in initial design can only respond to the change of a magnetic field with fixed polarity. Therefore, with regard to the system design manufacturers, a magnetic field with a specific polarity must be selected. Otherwise, the assembled system will not be able to operate in a normal way.

SUMMARY

Embodiments of the present invention improve magnetic induction detection and switching. In one embodiment the present invention includes a magnetic induction switching circuit comprising a magnetic induction unit having at least one output terminal, the magnetic induction unit generating at least a first signal in response to detecting a magnetic field having a first polarity, and generating at least a second signal in response to detecting a magnetic field having a second polarity, a first trigger circuit having at least one input terminal coupled to the magnetic induction unit and at least one output terminal, wherein the first trigger circuit generates a first trigger output signal in response to the first signal, and a second trigger circuit having at least one input terminal coupled to the magnetic induction unit and at least one output terminal, wherein the second trigger circuit generates a second trigger output signal in response to the second signal.

In one embodiment, the apparatus further comprises a programmable unit having a first input terminal coupled to the at least one output terminal of the first trigger circuit, a second input terminal coupled to the at least one output terminal of the second trigger circuit, and a first output terminal, and wherein the programmable unit couples the output of the first trigger circuit or the second trigger circuit between the first or second input terminal and first output terminal.

In one embodiment, the apparatus further comprises at least one transistor having a control terminal coupled to the first output terminal of the at least one programmable conduction circuit.

In one embodiment, the apparatus further comprises a detection control unit having a first input coupled to the at least one output terminal of the first trigger circuit and a second input couple to the at least one output terminal of the second trigger circuit, a first programmable conduction circuit having an input terminal coupled to the at least one output terminal of the first trigger circuit, an output terminal, and a control input coupled to the detection control unit, and a second programmable conduction circuit having an input terminal coupled to the at least one output terminal of the second trigger circuit, an output terminal, and a control input coupled to the detection control unit, wherein if the detection control unit detects a signal on the at least one output terminal of the first trigger circuit, then the first programmable conduction circuit couples the output of the first trigger circuit between the first input terminal and first output terminal of the first programmable conduction circuit, and the second programmable conduction circuit does not couple the output of the second trigger circuit between the first input terminal and first output terminal of the second programmable conduction circuit, and wherein if the detection control unit detects a signal on the at least one output terminal of the second trigger circuit, then the second programmable conduction circuit couples the output of the second trigger circuit between the first input terminal and first output terminal of the second programmable conduction circuit, and the first programmable conduction circuit does not couple the output of the first trigger circuit between the first input terminal and first output terminal of the first programmable conduction circuit.

In one embodiment, the magnetic induction unit comprises a Hall Effect circuit.

In one embodiment, the at least one output terminal of the magnetic induction unit is coupled to a negative input terminal of the first trigger circuit and a positive input terminal of the second trigger circuit, wherein the first trigger circuit further comprises a positive input terminal coupled to a first electric potential, and wherein the second trigger circuit further comprises a negative input terminal coupled to a second electric potential that is less than the first electric potential.

In one embodiment, the magnetic induction unit comprises a first output terminal and a second output terminal, and wherein the first output terminal of the magnetic induction unit is coupled to a positive input terminal of the first trigger circuit and to a negative input terminal of the second trigger circuit, and wherein the second output terminal of the magnetic induction unit is coupled to a negative input terminal of the first trigger circuit and to a positive input terminal of the second trigger circuit.

In one embodiment, the first and second trigger circuits are comparators.

In one embodiment, the first and second trigger circuits are Schmitt trigger circuits.

In another embodiment, the present invention includes an apparatus including a magnetic induction switching circuit comprising a magnetic induction device having a first terminal and a second terminal, the magnetic induction device generating a first signal on the first terminal in response to detecting a magnetic field having a first polarity, and generating a second signal on the second terminal in response to detecting a magnetic field having a second polarity, a programmable switching unit having a first input terminal coupled to the first terminal of the magnetic induction unit, a second input terminal coupled to the second terminal of the magnetic induction unit, and at least one output terminal, and a detection control unit for detecting the first and second signals coupled to the first and second terminals of the magnetic induction unit, wherein if the first signal is detected, the first signal is coupled between the first input terminal of the programmable switching unit and the at least one output terminal, and the second signal is not coupled to the at least one output terminal, and wherein if the second trigger signal is detected, the second signal is coupled between the second input terminal of the programmable switching unit and the at least one output terminal, and the first signal is not coupled to the at least one output terminal.

In one embodiment, the programmable switching unit comprises a first programmable conduction circuit and a second programmable conduction circuit.

In one embodiment, the magnetic induction device comprises first and second trigger circuits.

In one embodiment, the first and second trigger circuits are Schmitt trigger circuits.

In one embodiment, the first and second trigger circuits are comparators.

In one embodiment, the first and second trigger circuits are each have a positive input terminal and a negative input terminal, and wherein the positive input terminal of the first trigger circuit is coupled to both the negative input of the second trigger circuit and to at least one output terminal of a means for detecting a magnetic field.

In one embodiment, the at least one output terminal of the programmable switching circuit is coupled to the control terminal of a transistor.

In another embodiment, the present invention includes a method of detecting magnetic polarity comprising sensing a magnetic field, generating a first trigger signal on a first terminal when the magnetic field has a first magnetic polarity and generating a second trigger signal on a second terminal when the magnetic field has a second magnetic polarity, and detecting the first and second trigger signals, wherein if the first trigger signal is detected, the first trigger signal is coupled to the gate of a first transistor and the second terminal is not coupled to the gate of the first transistor, and wherein if the second trigger signal is detected, the second trigger signal is coupled to the gate of the first transistor and the first terminal is not coupled to the gate of the first transistor.

In one embodiment, the method further comprises generating a first signal in response to sensing the magnetic field, comparing the first signal to a first electric potential in a first circuit, and comparing the first signal to a second electric potential in a second circuit, wherein the first electric potential is greater than the second electric potential.

In one embodiment, the method further comprises generating a first signal and a second signal in response to sensing the magnetic field, comparing the first signal to the second signal in a first circuit, and in accordance therewith, generating the first trigger signal when the first signal is greater than the second signal, and comparing the first signal to the second signal in a second circuit, and in accordance therewith, generating the second trigger signal when the second signal is greater than the first signal.

In one embodiment, if the first trigger signal is detected a first programmable conduction circuit is configured to couple the first trigger signal between an input terminal and an output terminal of the first programmable conduction circuit, and a second programmable conduction circuit is configured to not couple the second trigger signal between an input terminal and an output terminal of the second programmable conduction circuit, and wherein if the second trigger signal is detected the second programmable conduction circuit is configured to couple the second trigger signal between an input terminal and an output terminal of the second programmable conduction circuit, and the first programmable conduction circuit is configured to not couple the first trigger signal between an input terminal and an output terminal of the first programmable conduction circuit.

The following detailed description and accompanying drawings provide a better understanding of the nature and advantages of the present invention.

DETAILED DESCRIPTION

Figure 1:
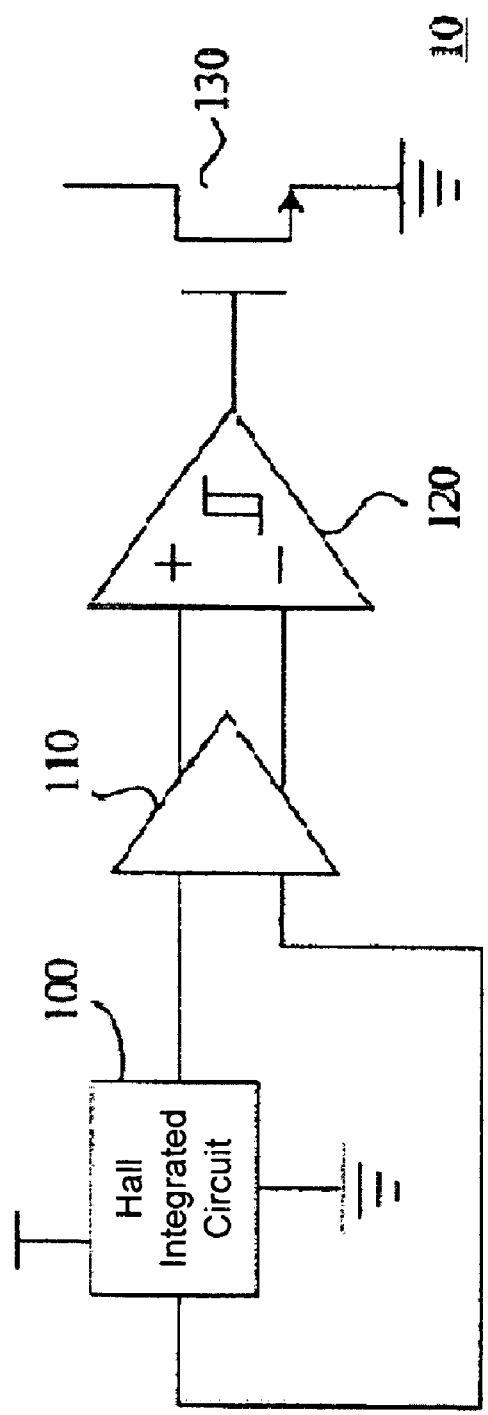
FIG. 1 is a prior art magnetic induction switching circuit.

Described herein are techniques for magnetic induction switching circuits. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Embodiments of the present invention include a type of magnetic induction switching circuit, which can selectively distinguish between magnetic field environments with different polarities.

In one embodiment, the present invention includes a device that uses the magnetic induction switching circuit, which can control which polarity of a magnetic field will be detected in response an external magnetic field environment, and may block the ability to detect the other polarity of a magnetic field.

For example, in one embodiment a magnetic induction switching circuit includes a magnetic induction device and the control unit. The magnetic induction device therein has a first trigger output terminal and a second trigger output terminal, and the first trigger output terminal and the second trigger output terminal respectively respond to a magnetic field strength proximate to the magnetic induction device to generate a first evoked electric potential and a second evoked electric potential. The control unit receives the first evoked electric potential and the second evoked electric potential, and blocks the second evoked electric potential after the first evoked electric potential has been received.

In one embodiment, the above-mentioned magnetic induction device includes the magnetic induction unit as well as the first and second trigger circuits. The magnetic induction unit has the first output terminal and the second output terminal, and responds to the above-mentioned magnetic field strength to change the output electric potential difference between the first output terminal and the second output terminal. The positive input terminal of the first trigger circuit is coupled to the first output terminal, the negative input terminal of the first trigger circuit is coupled to the second output terminal, and the first evoked electric potential as mentioned above is determined on the basis of the output electric potential difference. The negative input terminal of the second trigger circuit is coupled to the first output terminal, the positive input terminal of the second trigger circuit is coupled to the second output terminal, and the second evoked electric potential as mentioned above is determined on the basis of the output electric potential difference.

In one embodiment, the above-mentioned control unit includes the programmable unit and the detection control circuit. The programmable unit may include a first programmable circuit that is coupled to the first trigger output terminal and a second programmable circuit that is coupled to the second trigger output terminal. The detection control unit cuts off (i.e., turns off) one of the programmable circuits when an evoked electric potential is detected.

Embodiment of the present invention further includes a device that uses the magnetic induction switching circuit, which includes a magnetic field generation device, a magnetic induction switching circuit and a power supply device. The magnetic field generation device therein is used to generate the predetermined magnetic field. The magnetic induction switching circuit is used to respond to a magnetic field strength change, and generate signals that may be coupled to the control unit. The magnetic induction device has a first trigger output terminal and a second trigger output terminal. The first trigger output terminal and the second trigger output terminal, respectively, include signals generated in response to a magnetic field strength passed proximate to the magnetic induction device so as to deliver the first evoked electric potential and the second evoked electric potential. The control unit receives and delivers the first evoked electric potential and the second evoked electric potential, and stops delivery of the second evoked electric potential after the first evoked electric potential has changed. The power supply device provides the power that the magnetic induction switching device needs for operation.

Embodiment of the present invention may detect the magnetic field with polarity of both N pole and S pole. Accordingly, embodiments of the invention may include components with a specific magnetic field polarity as the trigger condition, which is highly convenient for the manufacturers. Additionally, after the polarity of the magnetic field is confirmed, it can actively cut off the response to the magnetic field with the other polarity, which can therefore avoid interference from other magnetic devices.

In order to make the above-mentioned features and advantages of the present invention clearer and easier to understand, example implementations are presented below with attached drawings.

Figure 2:
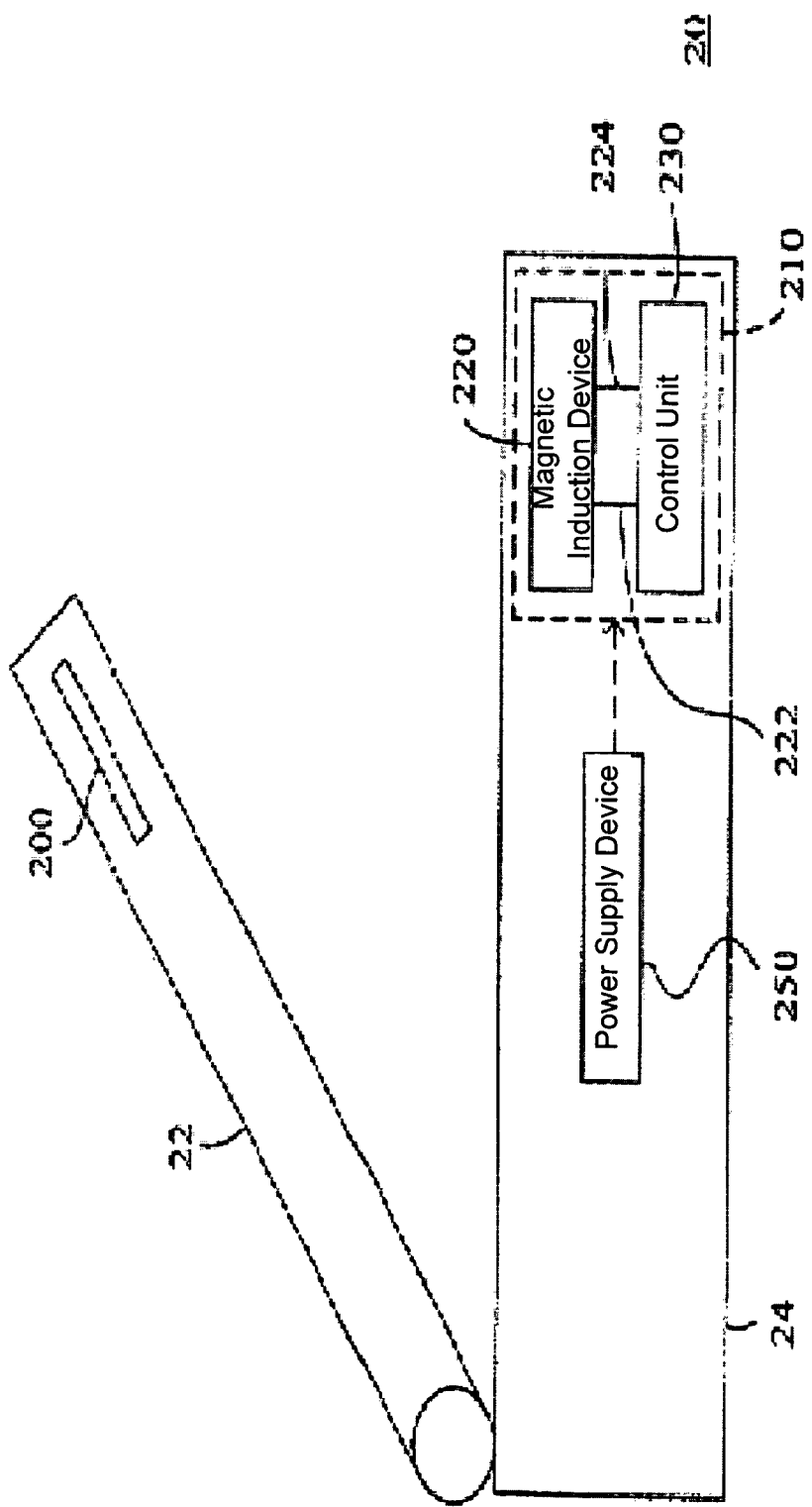
FIG. 2 is the structural diagram for the device that uses the magnetic induction switching circuit according to one embodiment of the present invention.

FIG. 2 is the structural diagram for the device that uses the magnetic induction switching circuit In this example, the device 20 includes the upper body 22 and the lower body 24. In the device, in order to detect whether or not the upper body and the lower body are closed, a magnetic field generation device 200 is provided in the upper body 22 to generate a fixed magnetic field, and a magnetic induction switching circuit 210 is provided in the lower body 24 together with a power supply device 250 to provide the magnetic induction switching circuit 210 with the power needed for operation. When device 20 includes a speaker (e.g., if the device is a mobile phone), the above-mentioned magnetic field generation device 200 may be the magnet in the speaker. The above-mentioned magnetic induction switching circuit 210 can detect the magnetic flux that results from the magnetic field as generated by the magnetic field generation device 200, and can determine whether or not the upper body and the lower body are properly closed on the basis of the detected result. The present invention may be used for a wide variety of body configurations, and it is to be understood that the upper body and lower body illustrated here are examples only.

The above-mentioned magnetic induction switching circuit 210 includes the magnetic induction device 220 and the control unit 230. The magnetic induction device 220 has the trigger output terminals 222 and 224, and the trigger output terminals 222 and 224 may generate outputs when a magnetic field is proximate to the magnetic induction device 220 so as to deliver the first evoked electric potential signal and the second evoked electric potential signal. The control unit 230 receives and delivers the above-mentioned first/second evoked electric potential signals, and stops transmission of the latest received evoked electric potential signal. For example, if the second evoked electric potential signal is receive after the first evoked electric potential signal, then the second signal will be blocked as described in more detail below.

Figure 3A:
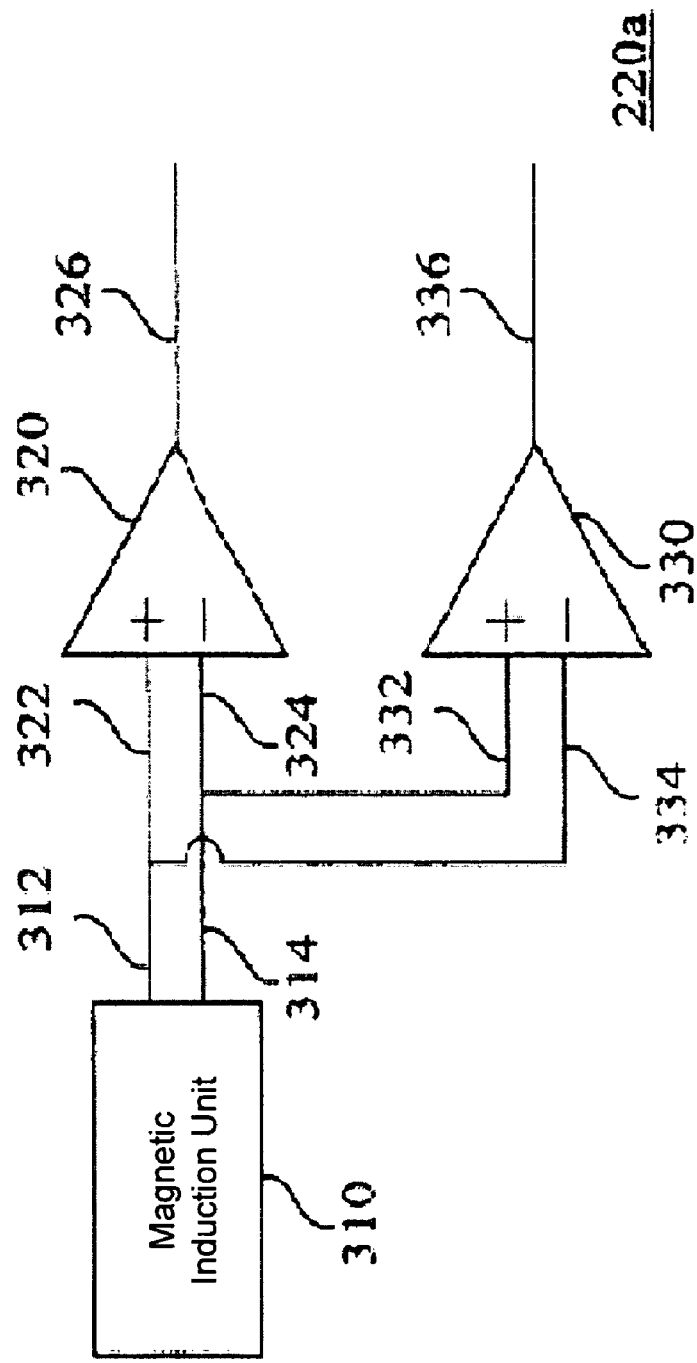
FIG. 3A is the internal circuit block diagram for a magnetic induction device according to one embodiment of the present invention.

FIG. 3A is an example of an internal circuit block diagram for a magnetic induction device. In this example, the magnetic induction device 220a includes a magnetic induction unit 310 and the trigger circuits 320 and 330. The magnetic induction unit 310 has the output terminals 312 and 314, and responds to a magnetic field proximate to magnetic induction unit 310 to change the output electric potential difference between the output terminal 312 and the output terminal 314. The positive input terminal 322 of the trigger circuit 320 is coupled to the output terminal 312, the negative input terminal 324 is coupled to the output terminal 314, and the evoked electric potential as delivered by the output terminal 326 (e.g., the above-mentioned trigger output terminal 222) is determined on the basis of the output electric potential difference as mentioned above. The positive input terminal 332 of the trigger circuit 330 is coupled to the output terminal 314, the negative input terminal 334 is coupled to the output terminal 312, and the evoked electric potential as delivered by the output terminal 336 (e.g., the above-mentioned trigger output terminal 224) is determined on the basis of the output electric potential difference as mentioned above.

Figure 3B:
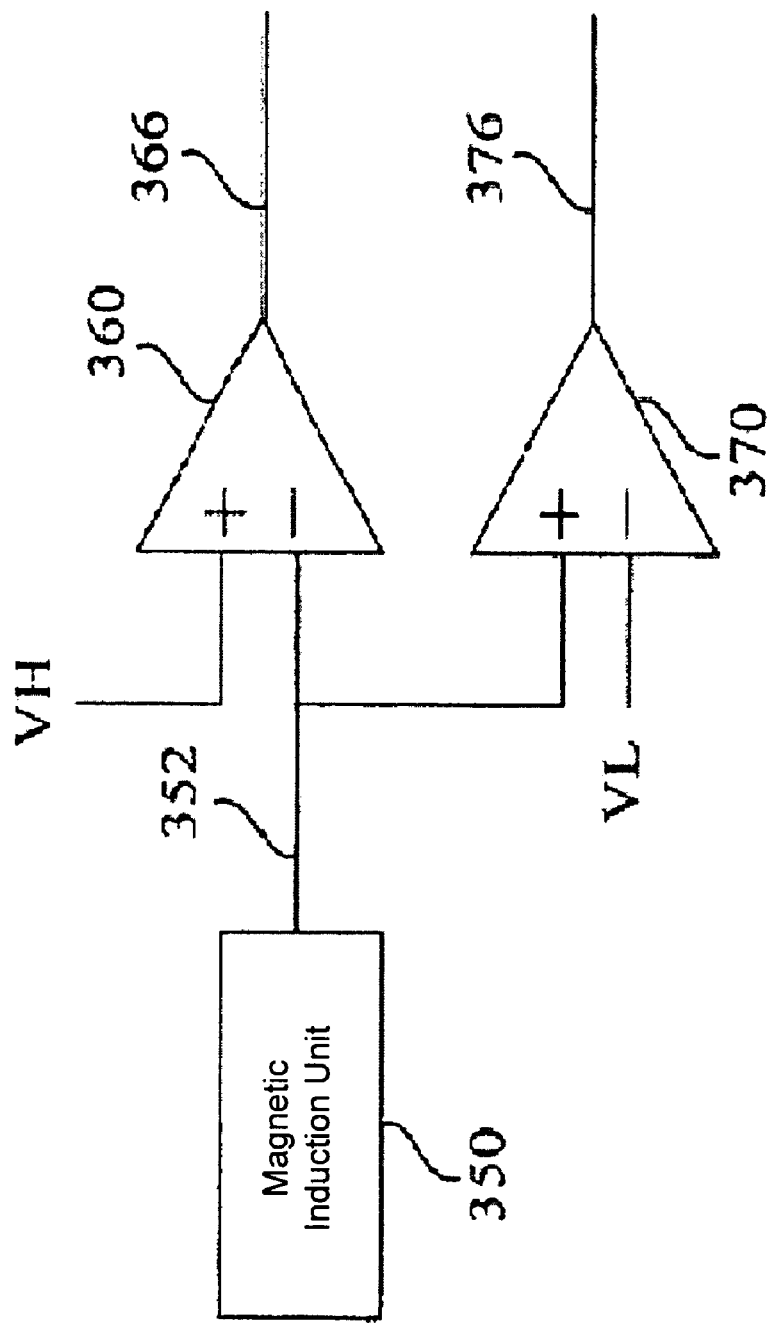
FIG. 3B is the internal circuit block diagram for a magnetic induction device according to one embodiment of the present invention.

Another example of an internal circuit block diagram for a magnetic induction device is as shown in FIG. 3B. The magnetic induction unit 350 therein responds to a magnetic field to change the electric potential of the output terminal 352. The output terminal 352 is coupled to the negative input terminal of the trigger circuit 360 and compared with a predetermined electric potential VH. Terminal 352 is also coupled to the positive input terminal of the trigger circuit 370 and compared with the predetermined electric potential VL that is less than the electric potential VH. The results obtained through comparison are respectively delivered at the output terminal 366 (e.g., the above-mentioned trigger output terminal 222) and the output terminal 376 (e.g., the above-mentioned trigger output terminal 224) as the corresponding evoked electric potentials. In some embodiments the above-mentioned trigger circuit can use Schmitt trigger circuits or comparators, for example.

Figure 4:
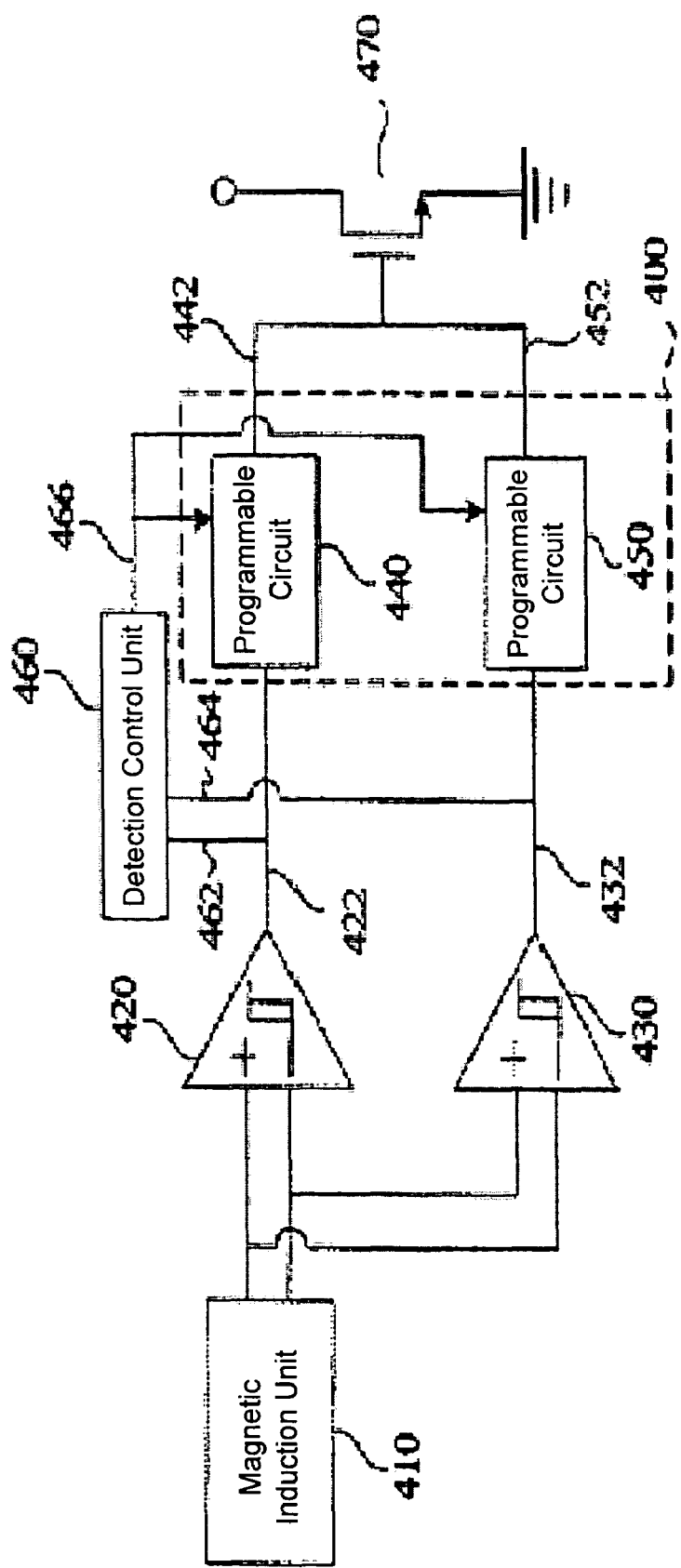
FIG. 4 is the circuit block diagram for a magnetic induction switching circuit according to one embodiment of the present invention.

FIG. 4 is an example of a magnetic induction switching circuit. In this example, magnetic induction switching circuit 40 includes a magnetic induction unit 410 and Schmitt trigger circuits 420 and 430, and the mode of operation thereof is similar to FIGS. 3A and 3B and will not be repeated here. Additionally, the control unit for the magnetic induction switching circuit 40 includes a detection control unit 460 and a programmable unit 400. The programmable switching unit 400 includes a programmable conduction circuit 440 coupled to the trigger output terminal 422 and a programmable conduction circuit 450 coupled to the trigger output terminal 432. Programmable conduction circuit 440 may include an input terminal coupled to trigger output terminal 422 and an output terminal 445. Similarly, programmable conduction circuit 450 may include an input terminal coupled to trigger output terminal 432 and an output terminal 452. Each programmable conduction circuit may couple the output of a trigger circuit between the input terminal and output terminal of the conduction circuit. Example programmable conduction circuits may include programmable transmission lines, controlled fuses, or equivalent circuits for creating a conduction path between an input terminal and output terminal in response to one or more control signals, which may be programmed.

The detection control unit 460 detects the evoked electric potentials at the trigger output terminals 422 and 432, and turns off one of the programmable conduction circuits (e.g., programmable circuit 450) coupled to the other evoked electric potential (such as the evoked electric potential as delivered at the trigger output terminal 432) when one of the evoked electric potentials (such as the evoked electric potential as delivered at the trigger output terminal 422) has been detected. For example, if a magnetic field generation device (e.g., device 200 as in FIG. 2) generates a magnetic field with N polarity, and the magnetic flux as produced by the magnetic field on the magnetic induction unit 410 changes the electric potential as delivered at the trigger output terminal 422 of Schmitt trigger circuit 420, then after being informed through the input terminal 462 of the generated electric potential change, the detection control unit 460 will make use of the output terminal 466 to deliver control signals so as to cut off the programmable conduction circuit 450. Similarly, if the magnetic flux as produced by the magnetic field on the magnetic induction unit 410 changes the electric potential as delivered at the trigger output terminal 432 of Schmitt trigger circuit 430, then after being informed through the input terminal 464 of the generated electric potential change, the detection control unit 460 will make use of the output terminal 466 to deliver control signals so as to cut off the programmable conduction circuit 440.

Furthermore, after the programmable conduction circuit 450 is turned off, detection control unit 460 may stop operation to avoid the situation in which the programmable circuit 440 is accidentally turned off and the entire magnetic induction switching circuit 40 is thus rendered inoperable. In that case, during subsequent operations, even if some other device generates the magnetic field with S polarity at the magnetic induction unit 410, the electric potential delivered by the programmable unit 400 will not change. For example, the transistor 470 may be under the control of the output terminals 442 and 452, but once the detection control unit 460 has determined the polarity of the external magnetic field, the transistor 470 will only be under the control of either the output terminal 442 or the output terminal 452.

Figure 5A:
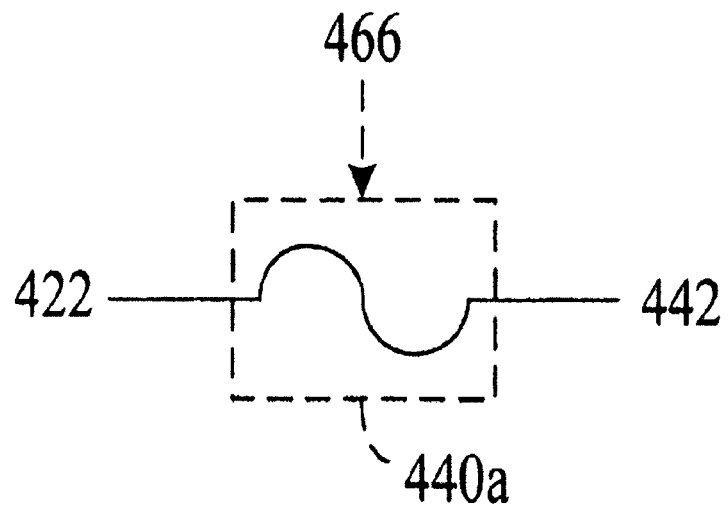
FIG. 5A is the circuit diagram for a programmable circuit according to one embodiment of the present invention.

As mentioned above, programmable circuit 440 or 450 is a type of circuit whose conduction from input to output can be set up through one or more control inputs, and there are many possible implementations. For example, any of a variety of controlled transmission line techniques could be used. FIG. 5A shows one example of a programmable circuit. Programmable circuit 440a in this example is a controlled fuse. One end of the fuse is coupled to the trigger output terminal 422 as shown in FIG. 4, while the other end is coupled to the output terminal 442. The control signal as delivered by the output terminal 466 can determine whether or not the fuse should be burned out, which therefore makes it easy to determine whether or not the programmable circuit 440a can be switched into conduction.

Figure 5B:
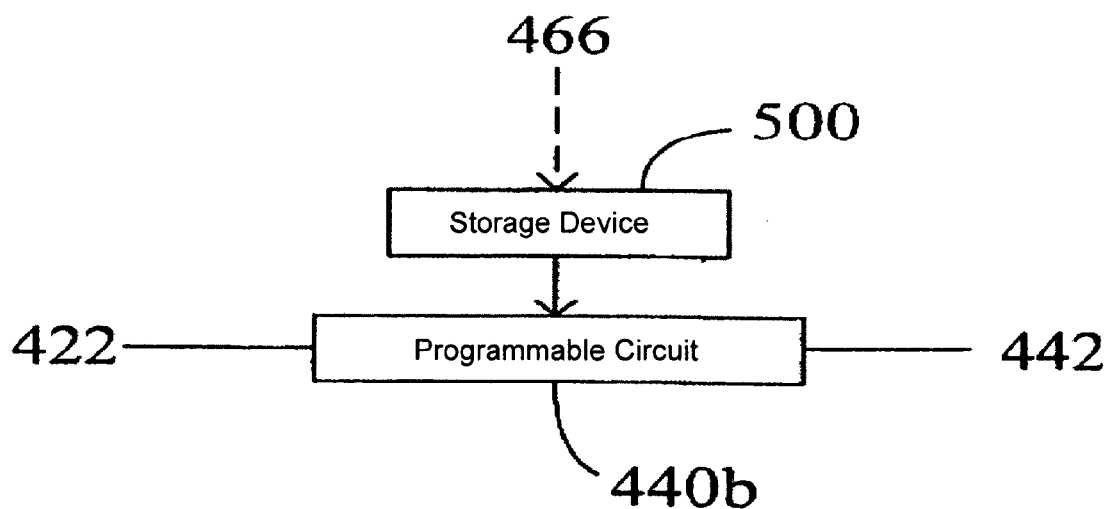
FIG. 5B is the circuit block diagram for a programmable circuit according to one embodiment of the present invention.

Another example of a programmable circuit is shown in FIG. 5B. FIG. 5B includes a storage device 500 between the programmable circuit 440b and the above-mentioned detection control unit 460. The detection control unit 460 makes use of the output terminal 466 to control storage of data in the storage device 500, and the data stored in the storage device 500 can then be used to determine whether or not the programmable circuit 440b should be switched into conduction. As known to people in this technical field, the storage device 500 can be a volatile or nonvolatile storage component. For example, an erasable programmable read-only memory (EPROM), an electrically erasable programmable read-only memory (EEPROM), or a flash memory (Flash) could be used. From the above examples, it is clear that the programmable conduction circuits may be initially on or off, and detection control unit may either turn one off and leave the other on in response to detecting a signal from a magnetic induction unit or turn one on and leave the other off.

Through the operations mentioned above, the magnetic induction switching circuit in initial setup can determine what different control signals should be kept in accordance with the difference of the external magnetic field. Therefore, it is not necessary to require the use of components with a specific magnetic field polarity as the trigger condition, which is highly convenient for the manufacturers. In addition, after the polarity of the magnetic field is detected, it can actively cut off the response to the magnetic field with the other polarity, which can therefore avoid interference from other magnetic devices.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method of detecting magnetic polarity comprising:
   sensing a magnetic field;
   generating a first trigger signal on a first terminal when the magnetic field has a first magnetic polarity and generating a second trigger signal on a second terminal when the magnetic field has a second magnetic polarity; and
   detecting the first and second trigger signals,
   wherein if the first trigger signal is detected, the first trigger signal is coupled to the gate of a first transistor and the second terminal is not coupled to the gate of the first transistor, and wherein if the second trigger signal is detected, the second trigger signal is coupled to the gate of the first transistor and the first terminal is not coupled to the gate of the first transistor.

2. The method of claim 1 further comprising:
generating a first signal in response to sensing the magnetic field;
comparing the first signal to a first electric potential in a first circuit; and
comparing the first signal to a second electric potential in a second circuit,
wherein the first electric potential is greater than the second electric potential.

3. The method of claim 1 further comprising:
generating a first signal and a second signal in response to sensing the magnetic field;
comparing the first signal to the second signal in a first circuit, and in accordance therewith, generating the first trigger signal when the first signal is greater than the second signal; and
comparing the first signal to the second signal in a second circuit, and in accordance therewith, generating the second trigger signal when the second signal is greater than the first signal.

4. The method of claim 1 wherein if the first trigger signal is detected a first programmable conduction circuit is configured to couple the first trigger signal between an input terminal and an output terminal of the first programmable conduction circuit, and a second programmable conduction circuit is configured to not couple the second trigger signal between an input terminal and an output terminal of the second programmable conduction circuit, and wherein if the second trigger signal is detected the second programmable conduction circuit is configured to couple the second trigger signal between an input terminal and an output terminal of the second programmable conduction circuit, and the first programmable conduction circuit is configured to not couple the first trigger signal between an input terminal and an output terminal of the first programmable conduction circuit.

5. An apparatus including a magnetic induction switching circuit comprising:
a magnetic induction unit having at least one output terminal, the magnetic induction unit generating at least a first signal in response to detecting a magnetic field having a first polarity, and generating at least a second signal in response to detecting a magnetic field having a second polarity;
a first trigger circuit having at least one input terminal coupled to the magnetic induction unit and at least one output terminal, wherein the first trigger circuit generates a first trigger output signal in response to the first signal;
a second trigger circuit having at least one input terminal coupled to the magnetic induction unit and at least one output terminal, wherein the second trigger circuit generates a second trigger output signal in response to the second signal;
a detection control unit having a first input coupled to the at least one output terminal of the first trigger circuit and a second input couple to the at least one output terminal of the second trigger circuit;
a first programmable conduction circuit having an input terminal coupled to the at least one output terminal of the first trigger circuit, an output terminal, and a control input coupled to the detection control unit; and
a second programmable conduction circuit having an input terminal coupled to the at least one output terminal of the second trigger circuit, an output terminal, and a control input coupled to the detection control unit,
wherein if the detection control unit detects a signal on the at least one output terminal of the first trigger circuit, then the first programmable conduction circuit couples the output of the first trigger circuit between the first input terminal and first output terminal of the first programmable conduction circuit, and the second programmable conduction circuit does not couple the output of the second trigger circuit between the first input terminal and first output terminal of the second programmable conduction circuit,
and wherein if the detection control unit detects a signal on the at least one output terminal of the second trigger circuit, then the second programmable conduction circuit couples the output of the second trigger circuit between the first input terminal and first output terminal of the second programmable conduction circuit, and the first programmable conduction circuit does not couple the output of the first trigger circuit between the first input terminal and first output terminal of the first programmable conduction circuit.

6. The apparatus of claim 5 further comprising at least one transistor having a control terminal coupled to the first output terminal of the at least one programmable conduction circuit.

7. The apparatus of claim 5 wherein the magnetic induction unit comprises a Hall Effect circuit.

8. The apparatus of claim 5 wherein the at least one output terminal of the magnetic induction unit is coupled to a negative input terminal of the first trigger circuit and a positive input terminal of the second trigger circuit, wherein the first trigger circuit further comprises a positive input terminal coupled to a first electric potential, and wherein the second trigger circuit further comprises a negative input terminal coupled to a second electric potential that is less than the first electric potential.

9. The apparatus of claim 5 wherein the magnetic induction unit comprises a first output terminal and a second output terminal, and wherein the first output terminal of the magnetic induction unit is coupled to a positive input terminal of the first trigger circuit and to a negative input terminal of the second trigger circuit, and wherein the second output terminal of the magnetic induction unit is coupled to a negative input terminal of the first trigger circuit and to a positive input terminal of the second trigger circuit.

10. The apparatus of claim 5 wherein the first and second trigger circuits are comparators.

11. The apparatus of claim 5 wherein the first and second trigger circuits are Schmitt trigger circuits.

12. An apparatus including a magnetic induction switching circuit comprising:
a magnetic induction device having a first terminal and a second terminal, the magnetic induction device generating a first signal on the first terminal in response to detecting a magnetic field having a first polarity, and generating a second signal on the second terminal in response to detecting a magnetic field having a second polarity;
a programmable switching unit having a first input terminal coupled to the first terminal of the magnetic induction unit, a second input terminal coupled to the second terminal of the magnetic induction unit, and at least one output terminal; and
a detection control unit for detecting the first and second signals coupled to the first and second terminals of the magnetic induction unit,
wherein if the first signal is detected, the first signal is coupled between the first input terminal of the programmable switching unit and the at least one output terminal, and the second signal is not coupled to the at least one output terminal, and wherein if the second trigger signal is detected, the second signal is coupled between the second input terminal of the programmable switching unit and the at least one output terminal, and the first signal is not coupled to the at least one output terminal.

13. The apparatus of claim 12 wherein the programmable switching unit comprises a first programmable conduction circuit and a second programmable conduction circuit.

14. The apparatus of claim 12 wherein the magnetic induction device comprises first and second trigger circuits.

15. The apparatus of claim 14 wherein the first and second trigger circuits are Schmitt trigger circuits.

16. The apparatus of claim 14 wherein the first and second trigger circuits are comparators.

17. The apparatus of claim 14 wherein the first and second trigger circuits are each have a positive input terminal and a negative input terminal, and wherein the positive input terminal of the first trigger circuit is coupled to both the negative input of the second trigger circuit and to at least one output terminal of a means for detecting a magnetic field.

18. The apparatus of claim 12 wherein the at least one output terminal of the programmable switching circuit is coupled to the control terminal of a transistor.

* * * * *